United States Patent [19]

Aoyama

[11] Patent Number: 4,584,529

[45] Date of Patent: Apr. 22, 1986

[54] METHOD AND APPARATUS FOR DISCRIMINATING BETWEEN GENUINE AND SUSPECT PAPER MONEY

[75] Inventor: Shuji Aoyama, Osaka, Japan

[73] Assignee: Bill Checker Co., Ltd., Osaka, Japan

[21] Appl. No.: 504,310

[22] Filed: Jun. 14, 1983

[30] Foreign Application Priority Data

Jun. 2, 1983 [JP] Japan ..................... 58-100055
Jun. 3, 1983 [JP] Japan ..................... 58-99696

[51] Int. Cl.⁴ .................. G01R 33/00; B07C 5/344; G06F 7/04; G07D 7/00

[52] U.S. Cl. .................. 324/261; 209/534; 209/567; 235/449; 324/226; 324/234; 324/262; 340/825.3; 340/825.34; 340/870.22; 340/870.31

[58] Field of Search .............. 324/226, 228, 233, 234, 324/235-343, 260-262, 329, 205, 207, 208, 200; 209/534, 562-567; 235/449, 450, 493; 340/825.3, 825.34, 825.35, 870.22, 870.31

[56] References Cited

U.S. PATENT DOCUMENTS

| | | | |
|---|---|---|---|
| 3,223,988 | 12/1965 | Danko | 209/534 X |
| 3,509,535 | 4/1970 | Berube | 324/226 X |
| 3,755,730 | 8/1973 | Vogelgesang | 324/262 X |
| 3,966,047 | 6/1976 | Steiner | 324/226 X |
| 3,976,199 | 8/1976 | Schachter | 209/534 |
| 4,114,804 | 9/1978 | Jones et al. | 235/449 X |
| 4,388,524 | 6/1983 | Walton | 235/449 X |

FOREIGN PATENT DOCUMENTS

| | | |
|---|---|---|
| 2830314 | 1/1980 | Fed. Rep. of Germany . |
| 2017996 | 10/1979 | United Kingdom . |

OTHER PUBLICATIONS

Kartashyan et al, "Improving the F4354/1 Tesla-Ammeter for the Investigation of Constant Magnetic Fields", INSPEC, Jan.-Feb. 1976, pp. 296-297.

*Primary Examiner*—Gerard R. Strecker
*Assistant Examiner*—Warren S. Edmonds
*Attorney, Agent, or Firm*—Hauke and Patalidis

[57] ABSTRACT

There is disclosed a paper money discriminating method comprising the steps of scanning and detecting magnetism contained in a print portion in a predetermined area of paper money, and checking number of pulses in a pulse signal converted from a magnetism detection signal. An apparatus for carrying out this method is also disclosed, which comprises a magnetic head, a pulse output means, and counters.

5 Claims, 6 Drawing Figures

METHOD AND APPARATUS FOR DISCRIMINATING BETWEEN GENUINE AND SUSPECT PAPER MONEY

BACKGROUND OF THE INVENTION

This invention relates to a paper money discriminating method and an apparatus therefor, and more particularly to a method and an apparatus for discriminating between genuine and counterfeit, or suspect paper money (such as dollar bills) printed in magnetic ink.

Techniques heretofore proposed for discriminating between truth and falsehood of paper money include, for example, a means to check a depicted pattern in a particular print portion of a bill by using a photoelectric sensor or the like to detect light and shade of that portion, and a means to check the type of printing ink (i.e. magnetic ink or not) by using a magnetism detecting sensor or the like to find out whether magnetism is present in a particular print portion of a bill.

However, the above conventional techniques have the following disadvantages.

The first mentioned means to check a depicted pattern optically has various inconveniences owing to the recent progress of printing technique which has made it difficult to discriminate between genuine and counterfeit, or suspect paper money only by a depicted pattern. That is to say, checking into details of the pattern would not only complicate the operation but also require an extended time for forming a judgment and would increase chances of operational errors. On the other hand, the latter means to determine the type of printing ink by presence or absence of magnetism is incapable of accurate discrimination between true money and false money where the false money is simply impressed, coated or adhered with a magnetic material, since this means consists only of checking to find out if the bill contains magnetism.

SUMMARY OF THE INVENTION

This invention has been devised having regard to the above state of the art, and the object thereof is to provide a paper money discriminating method and an apparatus therefore effective to discriminate simply and accurately between genuine and counterfeit, or suspect paper money printed in magnetic ink.

In order to achieve this object, the paper money discriminating method according to this invention is characterized by comprising the steps of scanning and detecting magnetism contained in a print portion in a predetermined area of paper money, and checking the number of pulses in a pulse signal converted from a magnetism detection signal.

In contrast with the prior art method of discriminating between genuine and counterfeit, or suspect paper money merely by checking whether the ink used is magnetic or not, the method of this invention having the above characteristic features checks the number of pulses in a pulse signal converted from a magnetism detection signal thereby to be able to check a pattern printed in magnetic ink. Consequently, discrimination between genuine paper money which has a certain pattern printed in magnetic ink in a certain position and false paper money which does not, is now carried out more reliably and easily than by the prior art method.

The paper money discriminating apparatus according to this invention to carry out the above method in an effective manner is characterized by comprising a magnetic head for scanning and detecting magnetism contained in a print portion in a predetermined area of the paper money, a window comparator for checking level of a magnetism detection signal from the magnetic head and converting the magnetism detection signal into a pulse signal, and counter means for counting the number of pulses in the pulse signal transmitted by the window comparator, whereby the paper money is judged to be genuine when the magnetism detection signal is at a level within a predetermined range and a numerical value shown by the counter means is within a predetermined range.

The basic construction of the apparatus of the invention is now described with reference to FIG. 1A showing its principle. A paper money or bill 1 has a certain area of print portion 1' for scanning which corresponds to a predetermined particular portion to be checked. A magnetism detector means comprising a magnetic head or the like 2 continuously scans and detects variations in magnetism contained in the ink of this print portion 1'. Then a magnetic level check means comprising a window comparator 3 or the like checks a resulting detection signal to find out whether its level is within a predetermined range or not, and at the same time converts the detection signal into a pulse signal. A mathematic means or counter 4 counts number of pulses in the pulse signal which shows changes in the magnetism detection signal corresponding to changes in the printed pattern obtained within a predetermined time t or within a time required for scanning the certain area of print portion 1'. The bill 1 is judged to be genuine money only when the magnetism detection signal S is at a level within the predetermined range and the number of pulses counted is within the predetermined range.

The above construction produces the following excellent effect.

By using the single window comparator paper money is checked in two steps, i.e. in respect of magnetic level in a predetermined print area and in respect of magnetic changes (which correspond to changes in the printed pattern) after converting the magnetism detection signal into pulses. Thus a reliable and easy checking is provided to discriminate between genuine paper money which has a certain pattern printed in magnetic ink in a certain position and counterfeit, or suspect money which does not.

Furthermore, as shown in FIG. 1B, the apparatus may include a means 17 to increase the magnetism of the magnetic ink in the print portion prior to scanning thereof. This addition assures a reliable checking of the printed pattern even if the money is printed in ink having weak magnetism or is old and its magnetism has become weak. Thus, discrimination between genuine paper money which has a certain pattern printed in magnetic ink in a certain position and counterfeit, or suspect paper money which does not, is effected with increased reliability and ease.

Other objects and advantages of this invention will be apparent from the following description.

DETAILED DESCRIPTION OF THE PREFERRED EMBODIMENT

Figure 2:
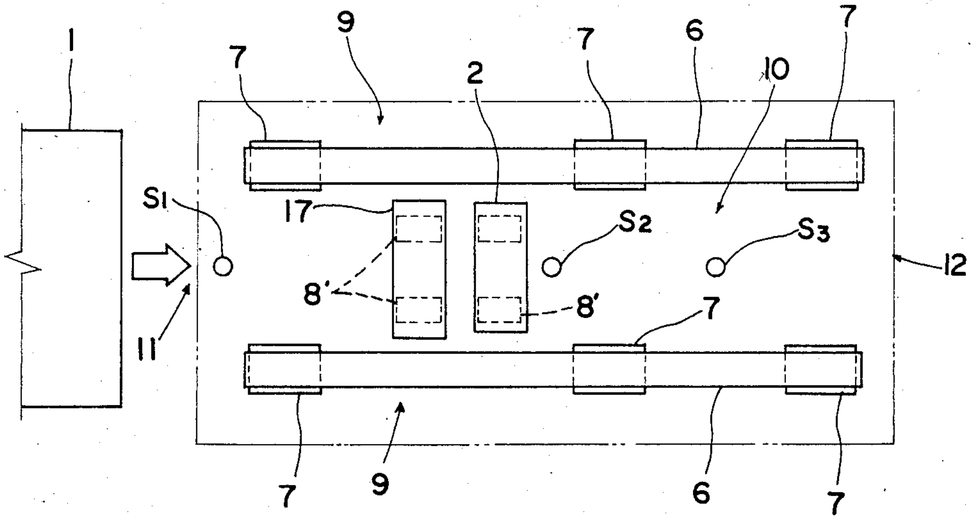
FIG. 2 is a plan view of a principal portion of a paper money discriminating apparatus embodying this invention.
Figure 3:
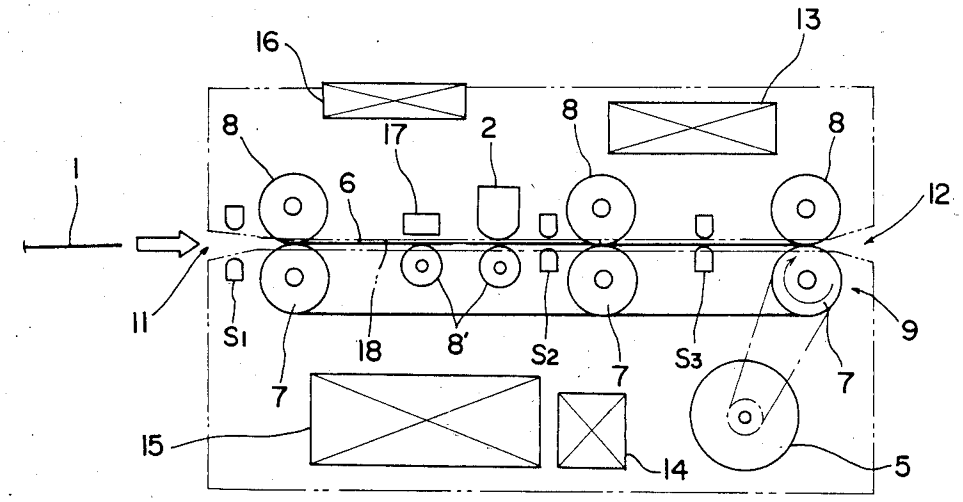
FIG. 3 is a side view of the principal portion.

Referring to FIGS. 2 and 3, the paper money discriminating apparatus according to this invention comprises a pair of bill conveyers 9 arranged at right and left sides of a bill passage section 10. Each of the bill conveyers 9 includes a plurality of drive rollers 7 driven by a motor 5 and operatively connected with one another by a belt 6 and a plurality of press rollers 8 arranged above and opposed to the respective drive rollers 7 to press paper money or bill 1 onto the drive rollers 7. Photoelectric sensors S1–S3 are provided adjacent a bill inlet 11, at a substantially middle position, and adjacent a bill outlet 12 of the bill passage section 10, respectively, to detect presence of the bill 1 introduced into the bill passage section 10. The apparatus further comprises a magnetic head 2 disposed adjacent and forwardly of the photoelectric sensor S2 at the middle of the bill passage section 10, to contact the bill 1 assisted by press rollers 8' and to detect magnetism of a print portion 1' in a predetermined area (described later) of the bill 1.

When the photoelectric sensor S1 detects entry of the bill 1 from the inlet 11, the motor 5 is put into forward rotation to drive the bill conveyers 9 thereby to advance the bill 1 toward the outlet 12 at a predetermined rate. Upon detection of passage of the bill 1 by the photoelectric sensor S2 at the middle, the magnetic head 2 starts action to detect magnetism of the print portion 1' in the predetermined area of the bill 1 and its detecting action continues over a predetermined period of time t. A resulting detection signal S is subjected to checking to determine whether the bill 1 is genuine or counterfeit, or suspect.

A description is made hereinafter of a discrimination system for discriminating between truth and falsehood of the bill 1.

Figure 4:
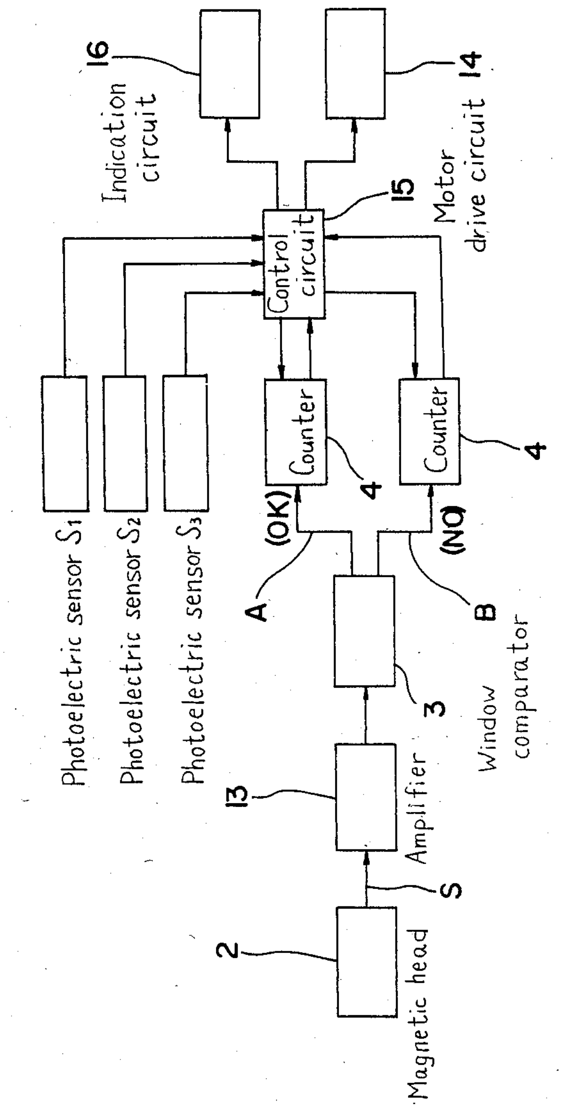
FIG. 4 is a block diagram showing a discrimination system according to this invention.

As shown in FIG. 4, the discrimination system comprises an amplifier 13 to amplify the detection signal S from the magnetic head 2 to a certain level, a window comparator 3 to act as means to check the level of an output signal of the amplifier 13, a first counter 4 to count number of pulses N1 of a pulse signal or output A of this comparator 3 converted from components of signal within a predetermined range ($V_o \pm v$) corresponding to a magnetic level of genuine paper money, a second counter 4' to count pulses N2 of a pulse signal B converted from components of the detection signal outside the predetermined range ($V_o \pm v$), a control circuit 15 to control a drive circuit 14 for the motor 5 in response to the respective numerical outputs of the first and second counters 4, 4' and to bill detection signals from the photoelectric sensors S1–S3, and an indication circuit 16 to indicate discrimination results.

Figure 5:
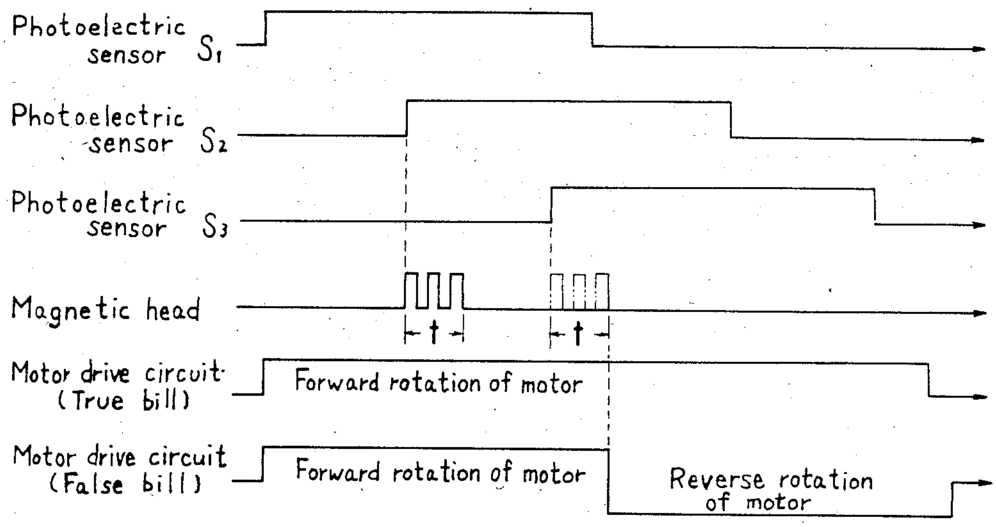
FIG. 5 is a time chart showing action of the discrimination system.

Referring to the time chart of FIG. 5, when the photoelectric sensor S1 detects entry of the bill 1 from the inlet 11, the motor 5 is put into forward rotation to advance the bill 1 toward the outlet 12 at the predetermined rate. Upon detection of passage of the bill 1 by the photoelectric sensor S2, the magnetic head 2 is put into the detecting action which continues over the predetermined period of time t. Its detection signal is converted by the window comparator 3 into pulse signals A, B whose pulses are counted by the counters 4, 4', respectively. When a pulse count value N1 resulting from a magnetic level detected of genuine paper money is within a predetermined range ($N_o \pm n$) corresponding to the number of pulses $N_o$ to be derived from the predetermined scan area 1' of the bill, the motor 5 is maintained at forward rotation and, upon detection of passage of the bill 1 by the photoelectric sensor S3, the detection circuit 16 acts to indicate that the bill 1 is genuine money. The bill 1 is discharged from the outlet 12 and the counters 4, 4' are reset thereby completing the checking of the bill 1. When the pulse count value N1 is outside the predetermined range, the motor 5 is put into reverse rotation to discharge the bill 1 from the inlet 11 and the indication circuit 16 acts to give a counterfeit, or suspect money indication.

When a count value N2 put out by the counter 4' of the pulse signal B converted from the detection signal S in the case that the magnetic level detected by the window comparator 3 is outside the predetermined range ($V_o \pm v$), exceeds a predetermined allowable value $n_o$, the motor 5 is put into reverse rotation to discharge the bill 1 from the inlet 11 and the indication circuit 16 acts to give a counterfeit, or suspect money indication. Then the counters 4, 4' are reset as in the preceding case thereby completing the checking of the bill 1.

Figure 1A:
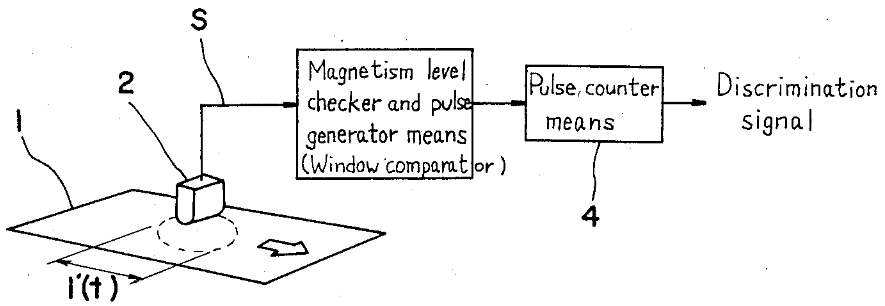
FIG. 1 is a block diagram illustrating a principle of an apparatus employing the method according to this invention.
FIG. 1B is a block diagram illustrating a modified apparatus.
Figure 1B:
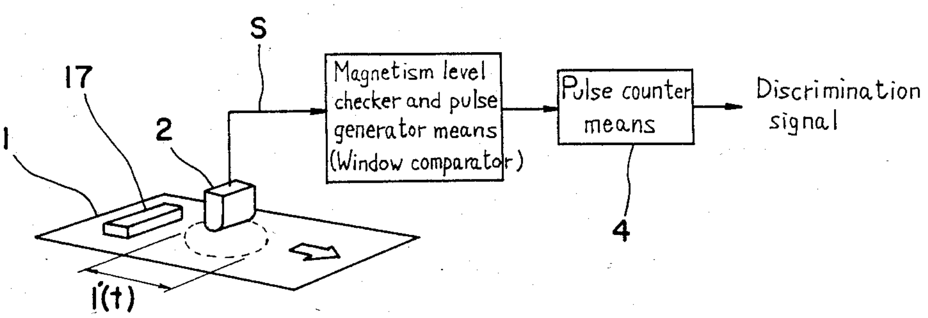

The described embodiment includes a permanent magnet 17, FIG. 1B, for magnetizing in advance the bill 1 introduced forwardly of the magnetic head 2 in order to increase magnetism of the magnetic ink for improved reliability of the discriminating operation. It is to be noted that the permanent magnet 17 may be replaced by an electromagnet.

Further, instead of checking only one area 1' of the bill 1 as in the described embodiment, a plurality of areas or positions may be checked as illustrated by dotted lines in FIG. 5. This may readily be achieved by changing the predetermined numerical values for the counters 4, 4' in order.

I claim:

1. A paper money discriminating method for discriminating between genuine and counterfeit, or suspect paper money printed in magnetic ink, said method comprising the steps of scanning and detecting magnetism contained in a print portion in a predetermined area of paper money, developing a magnetism detection signal from the detected magnetism, developing a pulse signal converted from said magnetism detection signal, checking the level of the magnetism detection signal in respect to a predetermined range ($Vo \pm v$) corresponding to a magnetic level of genuine money, converting said pulse signal into first and second pulse signals respectively, within and without said predetermined range of magnetic level, separately counting the number of pulses in said first and second pulse signals in respect to a predetermined range $N_o \pm n$ corresponding to a pulse count value derived from genuine money and controlling a discriminating function in response to the respective numerical outputs of said first and second counting steps, whereby the paper money is judged to be genuine when the magnetism detection signal is both: (a) at a level within said predetermined range of magnetic level and (b) of a numerical value within said predetermined range of pulse count value.

2. A paper money discriminating method as claimed in claim 1 further comprising the step of increasing the magnetism of the magnetic ink in the print portion prior to said scanning and detection step.

3. A paper money discriminating method as claimed in claim 1 wherein the paper money travels from an entrance point to an exit point when genuine and is caused to reverse its travel when suspect.

4. A paper money discriminating apparatus for discriminating between genuine or counterfeit, or suspect paper money printed in magnetic ink comprising a magnetic head for scanning and detecting magnetism contained in a print portion in a predetermined area of paper money to produce a magnetism detection signal, a window comparator for checking the level of the magnetism detection signal from the magnetic head in respect to a predetermined range ($V_o \pm n$) corresponding to a magnetic level of genuine money, said window comparator also converting the magnetism detection signal into first and second pulse signals from components thereof, respectively, within and without said predetermined range of magnetic level, first and second counter means for separately counting the number of pulses in said first and second pulse signals transmitted by the window comparator, said counting of such pulses being in respect to a predetermined range ($N_o \pm n$) corresponding to a pulse count value derived from genuine money, and control means responsive to the respective numerical outputs of said first and second counter means for controlling a discriminating function, whereby the paper money is judged to be genuine when the magnetism detection signal is both: (a) at a level within said predetermined range of magnetic level and (b) of a numerical value within said predetermined range of pulse count value.

5. A paper money discriminating apparatus as claimed in claim 4 further comprising means (17) to increase the magnetism of the magnetic ink in the print portion (1') prior to scanning of the print portion (1') by the magnetic head (2).

* * * * *